United States Patent
Mobin et al.

(10) Patent No.: US 10,643,676 B2
(45) Date of Patent: May 5, 2020

(54) SERIES RESISTANCE IN TRANSMISSION LINES FOR DIE-TO-DIE COMMUNICATION

(71) Applicant: Western Digital Technologies, Inc., San Jose, CA (US)

(72) Inventors: Sayed Mobin, Milpitas, CA (US); John Thomas Contreras, San Jose, CA (US); Pranav Balachander, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/146,294

(22) Filed: Sep. 28, 2018

(65) Prior Publication Data
US 2020/0105318 A1    Apr. 2, 2020

(51) Int. Cl.
G11C 5/06    (2006.01)
G11C 7/10    (2006.01)
G11C 5/04    (2006.01)

(52) U.S. Cl.
CPC .......... *G11C 7/1084* (2013.01); *G11C 7/1006* (2013.01); *G11C 7/1051* (2013.01); *G11C 5/04* (2013.01); *G11C 5/06* (2013.01); *G11C 7/10* (2013.01); *H01L 2224/1308* (2013.01); *H01L 2224/48227* (2013.01); *H01L 2224/73265* (2013.01)

(58) Field of Classification Search
CPC .... G11C 7/1084; G11C 7/1006; G11C 7/1051
USPC ................................................... 365/189.05
See application file for complete search history.

(56) References Cited

U.S. PATENT DOCUMENTS

| | | | | |
|---|---|---|---|---|
| 5,075,253 | A * | 12/1991 | Sliwa, Jr. ............... | H01L 23/52 257/723 |
| 8,093,954 | B1 * | 1/2012 | Lombaard ............. | H01L 23/647 257/159 |
| 8,930,647 | B1 * | 1/2015 | Smith .................. | G06F 9/44557 711/154 |
| 9,432,298 | B1 * | 8/2016 | Smith .................. | H04L 49/9057 |
| 2008/0032446 | A1 * | 2/2008 | Wood .................... | H01L 23/367 438/106 |
| 2009/0206962 | A1 * | 8/2009 | Chou ...................... | H04B 3/14 333/28 R |
| 2012/0032684 | A1 * | 2/2012 | Siddiquie ............. | G01R 31/046 324/538 |
| 2014/0002188 | A1 * | 1/2014 | Chen ..................... | H01L 29/812 330/250 |
| 2018/0018294 | A1 | 1/2018 | Park et al. | |
| 2018/0145054 | A1 | 5/2018 | Kim et al. | |
| 2019/0206450 | A1 * | 7/2019 | Contreras ............. | G11C 5/063 |

* cited by examiner

*Primary Examiner* — Ly D Pham
(74) *Attorney, Agent, or Firm* — Brinks Gilson & Lione

(57) ABSTRACT

An apparatus may include a controller die and a group of dies that communicate with each other via a transmission line. The transmission line includes a first portion integrated with a printed circuit board, and a second portion that includes a plurality of wire bonds bonded to input/output pads of the group of dies. The transmission line further includes a resistor circuit connected in series with the first portion and the second portion. The resistor circuit has a resistance value that provides reduced reflection coefficients over the transmission line between the first portion and the second portion. An on-die termination resistor circuit on the controller side is removed, with the inclusion of the resistor circuit.

20 Claims, 9 Drawing Sheets

SERIES RESISTANCE IN TRANSMISSION LINES FOR DIE-TO-DIE COMMUNICATION

BACKGROUND

A memory system may communicate signals carrying data, command, or clocking information for the storage of data within the memory system. The signals may be communicated along signal paths or transmission lines. Within a single signal path, different portions or segments may have their own characteristic impedance, which contributes to the overall characteristic impedance of the signal path. In general, it may be desirable for each of these different portions or segments to have the same characteristic impedance or as close to the same characteristic impedance as possible. Conversely, different or substantially different characteristic impedances between two or more of the different portions can lead to undesirable energy reflection, leading to degradation in signal integrity and ultimately performance. Additionally, termination circuits may be added at the ends of the transmission lines to provide impedance matching, and in turn improve signal quality. However, termination circuits typically consume power, which is undesirable. Accordingly, ways to both minimize the effects of impedance mismatches and reduce power consumption may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
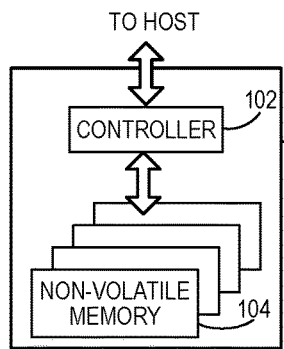
FIG. 1A is a block diagram of an example memory system.

By way of introduction, the below embodiments relate to improving transmission quality and reducing power consumption for communication between dies, such as a between a controller die and a group or stack of memory dies, through inclusion of a series resistor in a transmission line. In one embodiment, an apparatus includes: a controller die, a group of dies, and a transmission line coupled to the controller die and the group of dies. The transmission line includes: a first portion integrated with a printed circuit board, a second portion comprising a plurality of wire bonds, and a resistor circuit connected in series with the first portion and the second portion.

In some embodiments, the controller die is configured without an on-die termination resistance circuit coupled to the transmission line.

In some embodiments, the resistor circuit has a resistance value in between a character impedance of the first portion and a characteristic impedance of the second portion.

In some embodiments, the resistor circuit is disposed within an outer encasing that houses the group of dies.

In some embodiments, the resistor circuit is disposed on a die substrate on which the group of dies are disposed.

In some embodiments, the resistor circuit is disposed outside of an outer encasing that houses the group of dies.

In some embodiments, the resistor circuit is disposed on a planar surface of the printed circuit board.

In some embodiments, the group of dies comprises a first group of dies that is part of a first die package, the apparatus further comprising a second group of dies that is part of a second die package, and wherein the first die package and the second die package both transmit signals through the resistor circuit in order to communicate with the controller die.

In some embodiments, a die of the group of dies comprises an output driver circuit configured to generate a signal for transmission onto the transmission line with an output impedance, and a sum of a resistance value of the resistor circuit and the output impedance is dependent on a characteristic impedance of the first portion.

In some embodiments, the sum is in a range from about 65% to 90% of the characteristic impedance of the first portion.

In another embodiment, an apparatus includes a first die and a transmission line. The first die is configured to transmit a signal to a second die. The transmission line is configured to communicate the signal from the first die to the second die. In addition, the transmission line includes: a first portion having a first characteristic impedance, a second portion having a second characteristic impedance different than the first characteristic impedance, and a resistor circuit comprising a resistance value in between the first characteristic impedance and the second characteristic impedance.

In some embodiments, the second die is configured without an on-die termination resistance circuit coupled to the transmission line.

In some embodiments, the resistor circuit is positioned in the transmission line in between the first portion and the second portion.

In some embodiments, the resistor circuit is disposed within an outer encasing that houses a die stack comprising the first die.

In some embodiments, the resistor circuit is disposed outside of an outer encasing that houses a die stack comprising the first die.

In some embodiments, the resistor circuit is disposed on a planar surface of a printed circuit board.

In some embodiments, the first die is part of a first die package, the apparatus further includes a third die that is part of a second die package, and where the first die package and the second die package both transmit signals through the resistor circuit in order to communicate with the controller die.

In some embodiments, a die of the group of dies comprises an output driver circuit configured to generate a signal for transmission onto the transmission line with an output impedance, and a sum of a resistance value of the resistor circuit and the output impedance is dependent on the first characteristic impedance of the first portion.

In some embodiments, the sum is in a range from about 65% to 90% of the first characteristic impedance of the first portion.

In another embodiment, a method includes: transmitting a signal from an input/output pad of a first die over a wire bond portion of a transmission line; passing the signal through a resistor circuit connected in series with the wire bond portion after transmitting the signal over the wire bond portion; and propagating the signal over a printed circuit board portion of the transmission line to a second die after passing the signal through the resistor circuit.

Other embodiments are possible, and each of the embodiments can be used alone or together in combination. Accordingly, various embodiments will now be described with reference to the attached drawings.

EMBODIMENTS

The following embodiments describe systems, apparatuses, devices, circuits, and methods for improving transmission quality and reducing power consumption for communication between dies, such as a controller die and a group or stack of memory dies, through inclusion of a series resistor in a transmission line. Before turning to these and other embodiments, the following paragraphs provide a discussion of exemplary memory systems and storage modules that can be used with these embodiments. These are just examples, and other suitable types of systems, apparatuses, devices, or circuits, including other types of memory systems and/or storage modules, can be used.

FIG. 1A is a block diagram illustrating a memory system 100, such as a non-volatile memory system. The memory system 100 may include a controller 102 and memory that may be made up of a plurality of memory dies 104. As used herein, the term memory die refers to the set of memory cells (including non-volatile memory cells), and associated circuitry for managing the physical operation of those memory cells, that are formed on a single semiconductor substrate. In addition, the term die, in general, may refer to circuitry or circuit components on a single semiconductor substrate, but may or may not include memory cells to store data. The controller 102 may interface with a host system and transmit command sequences for read, program, and erase operations to the non-volatile memory dies 104. Herein, the controller 102 is referred to as a controller die 102 to identify or highlight that the circuitry of the controller 102 is configured or located on a die separate from the plurality of memory dies 104. The controller die 102 and each of the memory dies 104 may be configured or function as transceiver circuits, in that they each can transmit and receive signals. As described in further detail below, the controller die 102 and the plurality of memory dies 104 are configured to communicate with each other over a plurality of transmission lines.

The controller die 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller die 102 can be configured with hardware and/or firmware to perform the various functions described below. Also, some of the components shown as being internal to the controller die 102 can also be stored external to the controller die 102, and other components can be used. Additionally, the phrase "operatively in communication with" could mean directly in communication with or indirectly (wired or wireless) in communication with through one or more components, which may or may not be shown or described herein.

The controller die 102 is configured to manage data stored in memory cells of the memory dies 104 and also to communicate with a host, such as a computer or electronic device. The controller die 102 can have various functionality in addition to the specific functionality described herein. For example, the controller die 102 can format the memory cells and/or the circuitry of the memory dies 104 to ensure the memory dies 104 operate properly, map out bad or defective memory cells, and allocate spare cells to be substituted for future failed cells. Some part of the spare cells can be used to hold firmware to operate the controller die 102 and implement other features. In operation, when a host needs to read data from or write data to the memory die 104, the host communicates with the controller die 102. If the host provides a logical address to which data is to be read/written, the controller die 102 can convert the logical address received from the host to a physical address in the memory dies 102. (Alternatively, the host can provide the physical address). The controller die 102 may also be configured to perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller die 102 and the memory dies 104 may be any suitable memory interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Figure 1B:
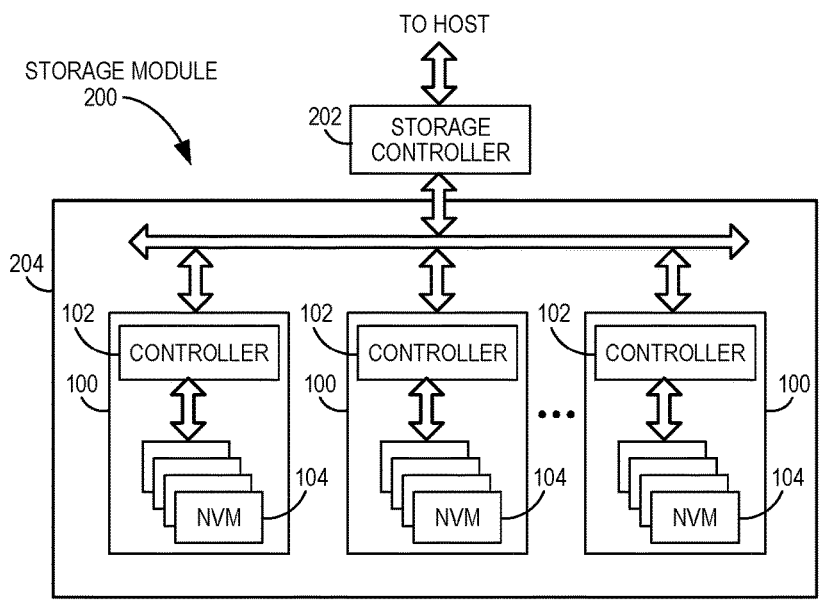
FIG. 1B is a block diagram of a storage module that includes a plurality of memory systems.

FIG. 1B illustrates a storage module 200 that includes a plurality of memory systems 100. As such, the storage module 200 may include a storage controller 202 that interfaces with a host and with a storage system 204, which includes a plurality of memory systems 100. The interface between the storage controller 202 and memory systems 100 may be a bus interface, such as a serial advanced technology attachment (SATA), a serial attached SCSI (SAS), a peripheral component interface express (PCIe) interface, an embedded MultiMediaCard (eMMC) interface, a SD interface, or a Universal Serial Bus (USB) interface, as non-limiting examples. The storage system 200, in one embodiment, may be a solid state drive (SSD), such as found in portable computing devices, such as laptop computers and tablet computers, and mobile phones.

Figure 1C:
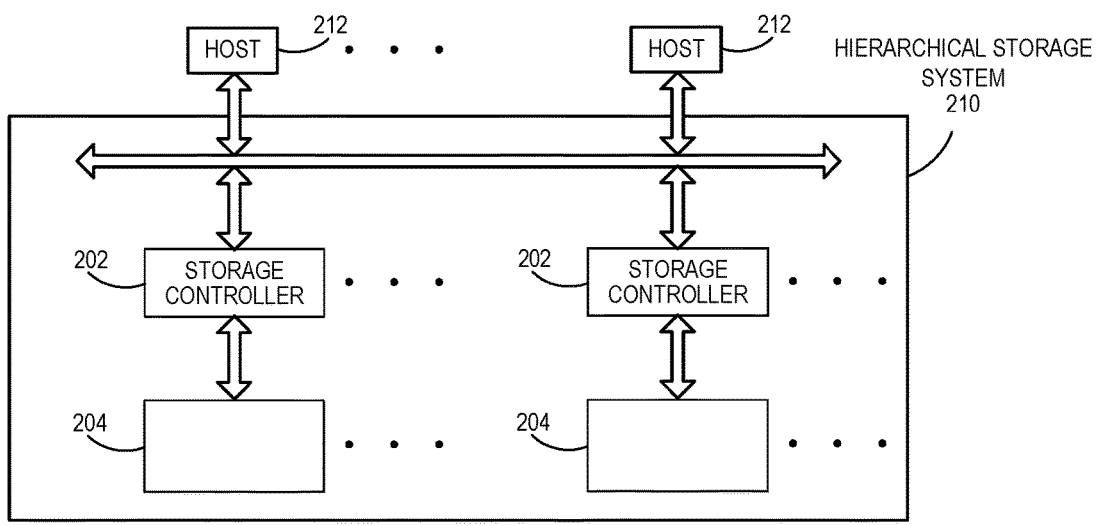
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a SAS interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
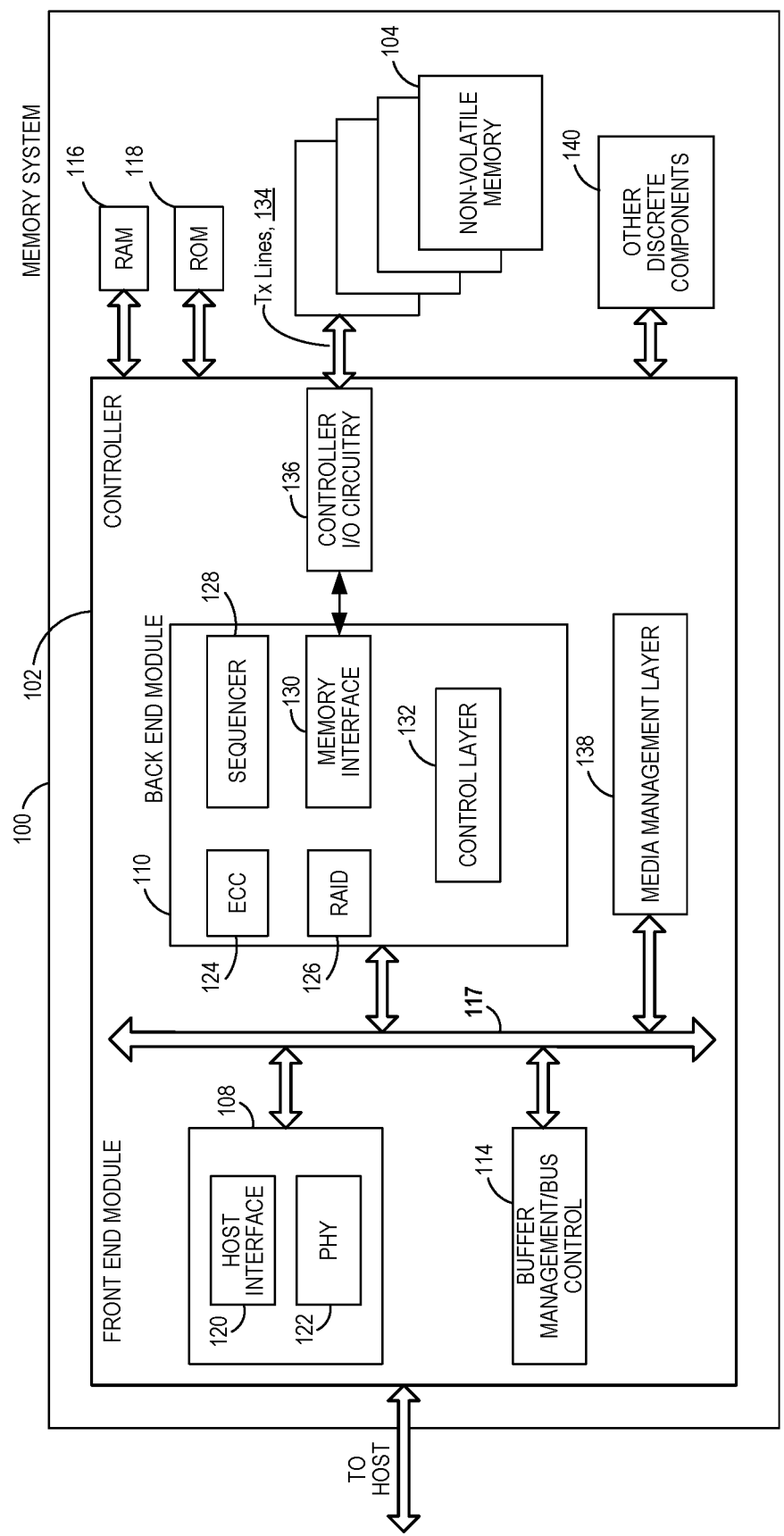
FIG. 2A is a block diagram of example components of a controller of the memory system of FIG. 1A.

FIG. 2A is a block diagram illustrating exemplary components of the controller die 102 in more detail. The controller die 102 may include a front end module 108 that interfaces with a host, a back end module 110 that interfaces with the memory dies 104, and various other modules that perform various functions of the memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller die 102 may include a buffer manager/bus controller module 114 that manages buffers in random access memory (RAM) 116 and controls the internal bus arbitration for communication on an internal communications bus 117 of the controller die 102. A read only memory (ROM) 118 may store and/or access system boot code. Although illustrated in FIG. 2A as located separately from the controller die 102, in other embodiments one or both of the RAM 116 and the ROM 118 may be located within the controller die 102. In yet other embodiments, portions of RAM 116 and ROM 118 may be located both within the controller die 102 and outside the controller die 102. Further, in some implementations, the controller die 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the memory dies 104. Additionally, the back end module 110 may include a RAID (Redundant Array of Independent Drives) module 128 that manages generation of RAID parity and recovery of failed data. The RAID parity may be used as an additional level of integrity protection for the data being written into the memory system 100. In some cases, the RAID module 128 may be a part of the ECC engine 124.

In addition, the back end module 110 may include a command sequencer 128 and a memory interface 130. The controller die 102 may include a control layer 132 (e.g., a flash controller layer) that controls the overall operation of the back end module 110.

The command sequencer 128 may be configured to generate command sequences, such as program, read, and erase command sequences, to be transmitted to the memory dies 104. The commands of the command sequences that the command sequencer 128 outputs may be referred to as context commands. For example, commands of command sequences for read operations may be referred to as read context commands, and commands of command sequences for write operations may be referred to as write context commands.

The memory interface 130 is configured to output the command sequences or context commands to the memory dies 104 and receives status information from the memory dies 104. Along with the command sequences and status information, the memory interface 130 may also be configured to send and receive data, such as in the form of data signals, to be programmed into and read from the memory dies 104. The memory interface 130 may also be configured to output clock signals or strobe signals to control the timing at which the memory dies 104 receive data signals carrying data to be programmed and/or at which the memory dies 104 output data signals carrying data the controller die 102 wants read from the memory dies 104.

As shown in FIG. 2A, the memory system 100 may include a plurality of transmission (Tx) lines (or channels) 134 connecting the controller die 102 and the plurality of memory dies 104. In general, a transmission line is any conductive structure or combination of conductive structures configured to conduct alternating current (AC) or radio frequency (RF) signals from a transmitter that is transmitting the signals to a receiver that is receiving the signals. For the example memory systems described herein, transmission lines are included to communicate signals between (including to and from) the controller die 102 and the memory dies 104. The controller die 102 and the memory dies 104 may be configured to communicate signals—including data signals, clock signals, and command signals—over the plurality of transmission (Tx) lines 134. A signal that is communicated between the controller die 102 and the memory dies 104 may be either transmitted from the controller die 102 over one of the transmission lines 134 to the memory dies 104, or transmitted from the memory dies 104 over one of the transmission lines 134 to the controller die 102. In this context, the controller die 102 and each of the memory dies 104 may be configured as transceiver circuits (or dies) in that they may each be configured to transmit and receive signals.

The controller 102 may be coupled to the transmission lines 134 via its memory interface 130. When the controller die 102 wants to send a signal to the memory dies 104, the controller die 102 may send the signal through its memory interface 130 onto one of the transmission lines 134. The memory dies 104 may each have their own respective memory interfaces to send and receive signals, as described in further detail below with respect to FIG. 3. When referring to the memory interfaces, the memory interface of the controller die 102 may be referred to as a controller-side memory interface 130, and the memory interfaces of the memory dies 104 may be referred to as memory-side memory interfaces.

Additionally, the memory interface 130 may include or be in communication with controller input/output (I/O) circuitry 136, which includes the circuitry that sends, receives, and generates the analog signals communicated on the transmission lines 134. The controller I/O circuitry 136 may include any of various configurations or circuitry topologies to send, receive, and generate signals. For example, to generate and output signals onto the transmission lines 134, the controller I/O circuitry 136 may include output driver circuits, such as in the form of push-pull circuits, that generate analog signals on the transmission lines 134 at certain predetermined high and low voltage levels. Also, to receive signals from the transmission lines 134, the controller I/O circuitry 136 may include input circuitry, such as in the form of input buffers, which, in some embodiments, may include comparators, such as Schmitt triggers or differential comparators, as non-limiting examples. In various embodiments, the I/O circuitry 136 may include other circuit components, such as pre-driver circuits, level shifter circuits, sampling circuits (e.g., latches or flip flops), and/or multiplexers, to transmit, receive, and generate the signals communicated on the transmission lines. Additionally, the controller I/O circuitry 136 may include conductive components, such as I/O contact pads disposed on the controller die 102 that connect to the transmission lines 134.

Additionally, the memory interface 130 and/or the controller I/O circuitry 136 may be configured to communicate with the memory dies 104 over the transmission lines 134 using any of various transmission modes, types, protocols, standards, or formats, non-limiting examples of which include double data rate (DDR), and/or a Toggle Mode (TM), such as TM 200, 400, or 800.

Additional modules of the non-volatile memory system 100 illustrated in FIG. 2A may include a media management layer 138, which may perform certain memory functions, such as address management (e.g., address translation) and wear leveling of memory cells of the memory dies 104. The memory system 100 may also include other discrete components 140, such as external electrical interfaces, external RAM, resistors, capacitors, or other components that may interface with the controller die 102. In alternative embodiments, one or more of the RAID module 128, media management layer 138 and buffer management/bus controller 114 are optional components that may not be necessary in the controller die 102.

Figure 2B:
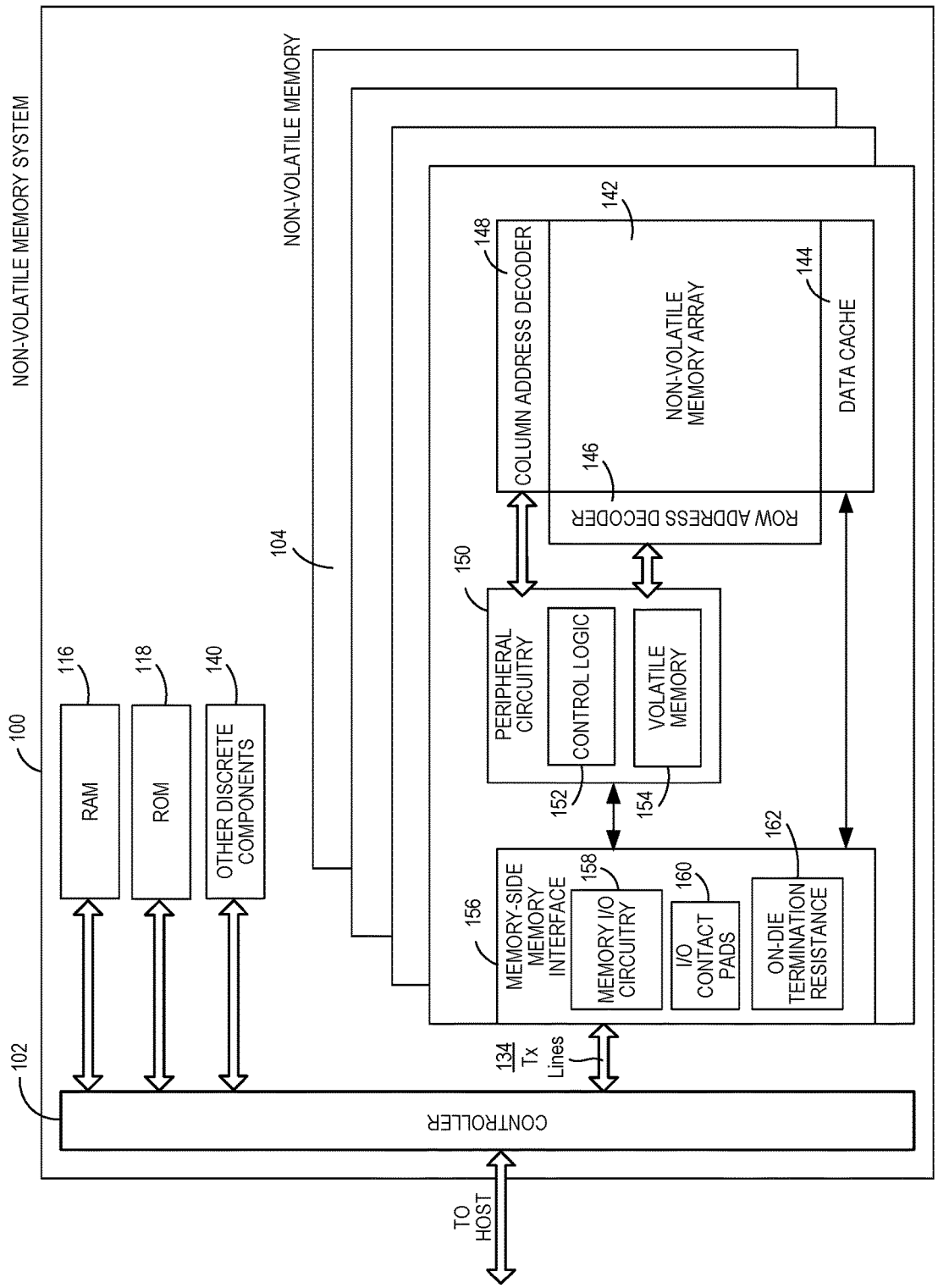
FIG. 2B is a block diagram of example components of a non-volatile memory die of the memory system of FIG. 1A.

FIG. 2B is a block diagram illustrating exemplary components of one of the memory dies 104 in more detail. The non-volatile memory die 104 may include a memory cell structure 142. In some example configurations, the memory cell structure 142 may be configured in the form of an array, such as two-dimensional or a three-dimensional array.

Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Additional way of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

The memory die 104 may further include a page buffer or data cache 144 that caches data that is sensed from and/or that is to be programmed to the memory cell structure 142. The memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the memory die 104 may include peripheral circuitry 150. The peripheral circuitry 150 may include control logic circuitry (otherwise referred to as an on-chip controller, memory die controller, or simply controller) 152, which may be implemented as a state machine, that provides on-chip control of memory operations as well as provide status information to the controller 102. The peripheral circuitry 150 may also include volatile memory 154. An example configuration of the volatile memory 154 may include latches, although other configurations are possible.

Also, the memory die 104 may include a memory-side memory interface (or just memory-side interface) 156 that is configured to interface and communicate with the controller-side memory interface 130 of the controller die 102. In particular, the memory-side interface 156 may be coupled with the transmission lines 134 of the memory system 100. When a given memory die 104 is to transmit a signal to the controller die 102, the given memory die 104 may transmit the signal via its memory-side interface 156 onto one of the transmission lines 134 to the controller die 102. Additionally, when a given memory die 104 is to receive a signal from the controller die 102, the given memory die 104 may receive the signal via its memory-side interface 156 from one of the transmission lines 134. As described in further detail below, components of the memory-side interface 156, along with die capacitance of the dies may form part of and/or determine characteristics impedances of the transmission lines 134.

The memory-side interface 156 may include memory input/output (I/O) circuitry 158 that is configured to send, receive, and generate signals, including data signals carrying data, command signals identifying commands, clock signals, or other types of signals carrying other information to be transmitted to and received from the controller die 102. For example, data sensed into the data cache 144 may be sent to the memory I/O circuitry 158 for transmission to the controller die 102. Similarly, data received from the controller die 102 may be received by the memory I/O circuitry 158, and the memory I/O circuitry 158 may communicate the data to the data cache 144. Additionally, commands to be communicated between the controller die 102 and the control logic 152 may be communicated via the memory I/O circuitry 158. The memory I/O circuitry 158 may be configured similar to and/or have similar or the same circuit topologies have any of various circuit or combinations of circuits, including output driver circuits, such as in the form of push-pull circuits, to generate and output signals onto the transmission lines 134, and input buffers, such as in the form of comparators and/or Schmitt trigger circuits to receive signals on the transmission lines 134. Any of various suitable circuit configurations to transmit, receive, and generate signals and connect to the transmission lines 134 to communicate the signals may be possible.

Additionally, the memory-side interface 156 may include input/output (I/O) contact pad portions 160 in communication with the memory I/O circuitry 158. For example, the signals that the memory I/O circuitry 158 generates for transmission to the controller die 102 may be communicated from the output driver circuits of the memory I/O circuitry 158 to the I/O contact pads 160. Similarly, the signals that the memory-side interface 156 receives from the controller die 102 may be sent from the I/O contact pads 160 to input circuits (e.g., input buffer circuits) of the memory I/O circuitry 158. In addition, as described in further detail below, the I/O contact pads 160, along with wire bond elements (WBE) (shown in FIG. 3) may form or be part of the transmission lines 134 over which the memory dies 104 and the controller die 102 communicate signals between each other.

Also, in at least some embodiments, as shown in FIG. 2B, the memory-side interface 156 may include on-die termination (ODT) resistance circuitry 162, which may include one or more resistors or other circuit components (active and/or passive) providing a resistance. The on-die termination resistance circuitry 162 may provide termination resistance or impedance for the transmission lines 134, and may be used for impedance matching between the memory dies 104 and the transmission lines 134. The on-die termination resistance circuitry 162 may be connected to the I/O contact pads 160. In addition, for at least some embodiments, the on-die termination resistance circuitry 162 may provide variable resistance levels or values, including one or more high levels and one or more low levels, as described in further detail below. The resistance levels or values that the on-die termination resistances provide may be controlled by the controller die 102, the on-die control logic 152, or a combination thereof.

Figure 3:
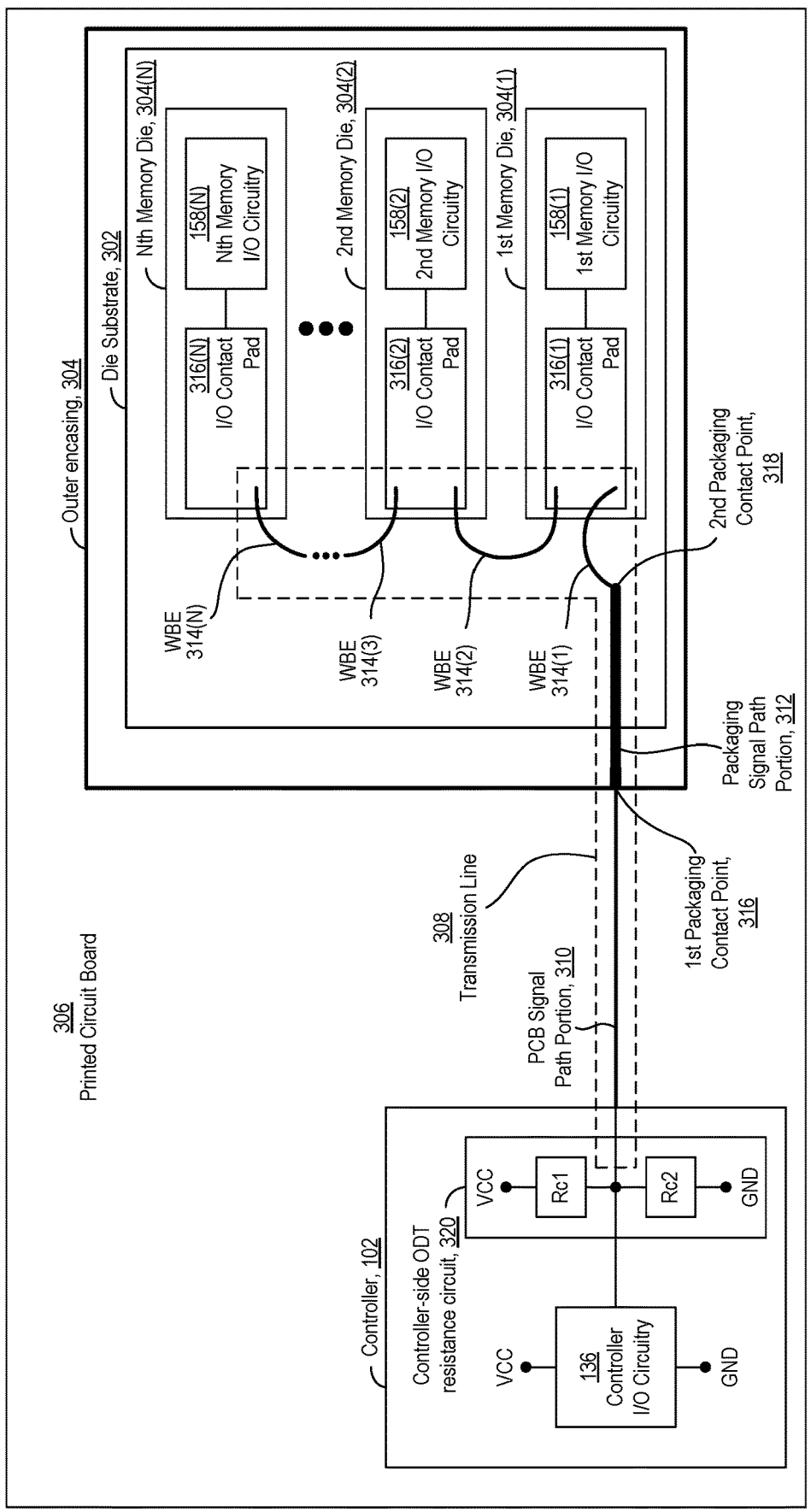
FIG. 3 is a physical layout of an example configuration of at least some of the components of the controller and an N-number of a plurality of memory dies of FIGS. 1A-2B.

FIG. 3 shows a physical layout of an example configuration of at least some of the components of the controller die 102 and the plurality of memory dies 104 shown in FIGS. 1A-2B. In FIG. 3, at least some of the memory dies 104 are represented by an N-number memory dies 304, including a first memory die 304(1), a second memory die 304(2), and an Nth memory die 304(N). In various embodiments, N may be any integer of two or more. The N-number of memory dies 304(1)-304(N) may be all of the memory dies 104 in the memory system 100, or may be less than all of the memory dies 104. For example, the N-number of memory dies 304(1)-304(N) may be located on the same chip and/or may be part of the same chip enable group. The memory system 100 may include a single chip or chip enable group in which the memory dies 104 are located. The N-number of dies 304 of FIG. 3 may be representative of that single chip or chip enable group of dies. Alternatively, the memory system 100 or may include multiple chips or chip enable groups, and some of the memory dies 104 may be located on one chip or in one chip enable group, while other memory dies 104 may be located on one or more other chips or in one or more other chip enable groups. The N-number of dies 304 of FIG. 3 may be representative of one of the plurality of chips or chip enable groups. In addition or alternatively, the N-number of dies 304 may be configured as or part of the same die stack. Various configurations are possible. Further details of dies configured as a die stack are described in further detail below with reference to FIG. 4.

In the example configuration shown in FIG. 3, the memory dies 304(1)-304(N) may be configured in and/or integrated with a packaging that include various packaging components, including a package or die substrate 302 on which the memory dies 303 are disposed or mounted, and an outer encasing or cover that encases, covers, houses, and/or protects the dies. Other packaging components may be included, such as traces and vias integrated in the die substrate 302, solder balls, contact pads, wire bonds, as non-limiting examples, at least some of which are described in further detail below. The controller die 102 may be configured and/or implemented as its own chip and/or integrated with its own packaging separate to that of the memory dies 304(1)-304(N). (For simplicity, packaging components of the controller die 102 are not shown in FIG. 3). The controller die 102 and the memory dies 304(1)-304(N) integrated with the packaging may be integrated on a printed circuit board 306, as shown in FIG. 3.

The controller die 102 and the memory dies 304(1)-304(N) may communicate signals between each other on transmission lines (e.g., at least some of the transmission lines 134 of FIGS. 2A and 2B) connecting the controller die 102 and the memory dies 304(1)-304(N). For simplicity, the physical layout of FIG. 3 shows a single transmission line 308 connecting the controller die 102 and the memory dies 304(1)-304(N). However, in actual implementation as described with reference to FIGS. 2A and 2B, there may be multiple transmission lines between the controller 102 and the memory dies 304(1)-304(N) configured to communicate data signals, clock signals, strobe signals, command signals, status signals, or any other type of signals between the controller die 102 and the memory dies 304. The multiple (at least two) transmission lines may be configured in parallel with each other such that two or more signals propagating on two or more parallel transmission lines may be communicated separately and/or simultaneously.

In addition, the transmission line 308 may be a unidirectional transmission line or a bidirectional transmission line. A unidirectional line is a transmission line that is configured to communicate signals one way or in one direction, either only from the controller die 102 to the memory dies 304, or only from the memory dies 304 to the controller die 102. In contrast, a bidirectional line is a transmission line that is configured to communicate signals both ways or in both directions, from the controller die 102 to the memory dies 304, and from the memory dies 304 to the controller die 102. For configurations that include multiple transmission lines, in various embodiments, all of the transmission lines may be unidirectional lines, all of the transmission lines may bidirectional lines, or the transmission lines may include a combination of at least one unidirectional line and at least one bidirectional line. Various configurations of unidirectional and/or bidirectional transmission lines may be possible.

Additionally, for some example configurations, the transmission line 308 may be configured as a single-ended transmission line or signal path configured to communicate a single-ended signal. For such configurations, the single-ended transmission line 308 may be electrically coupled to a ground reference or return path (not shown in FIG. 3). For other example configurations, the transmission line 308 may be one of the conductive paths of a differential transmission line or signal path configured to communicate a differential signal. As described in further detail below, the transmission line 308 may include any of various types of conductive elements, such as traces, vias, solder balls, contact pads, wire bonds, as non-limiting examples, to communicate a signal between the controller 102 and the memory dies 304.

In general, in the example configuration shown in FIG. 3, the transmission line 308, whether it be for a single-ended configuration or a differential configuration, may include a printed circuit board (PCB) portion 310, a packaging portion 312, a wire bond portion 314, and an input/output (I/O) contact pad portion 316.

The PCB portion 310 may be integrated with the printed circuit board 306 and extend between the controller die 102 and the memory die packaging. In addition, the PCB portion may be implemented as a conductive trace (such as in the form of a microstrip or a stripline, for example), one or more vias, a combination of traces and vias, or any other type of conductive element configured to carry a signal over the printed circuit board 306 from the controller die 102 to the memory die packaging.

In addition, the packaging portion 312 of the transmission line 308 may be configured to communicate signals between the PCB signal portion 310 and the wire bond portion 314. The packaging portion 312 may include a first packaging contact point 316 that connects to the PCB portion 310 in order to communicate signals between the PCB portion 310 and the packaging portion 312, and a second packaging contact point 318 that connects to the wire bond portion 314 in order to communicate signals between the packaging portion 312 and the wire bond portion 314. The packaging portion 312, including the first and second contact points 316, 318 may include any of various conductive elements and/or combinations of conductive elements to communicate signals between the PCB portion 310 and the wire bond portion 314, examples of which include solder balls, such as those of a ball grid array structure, vias and/or traces integrated in the die substrate 302, contact pads, and wire bonds. Various configurations for connecting the PCB portion 310 with the wire bond portion 314 are possible.

Additionally, the wire bond portion 314 may include an N-number of wire bond elements (WBE) (or just wire bond) 314(1) to 314(N), and the I/O contact pad portion 316 may include an N-number of I/O contact pads 316(1) to 316(N). Each of the I/O contact pads 316(1) to 316(N) may be integrated with, such as by being disposed on, a respective one of the N-number of memory dies 304(1) to 304(N). For at least some example configurations, such as the one shown in FIG. 3, a first wire bond 314(1) includes a first end connected to the second packaging contact point 318 and a second end connected to the I/O contact pad 316(1) of the first memory die 304(1). The other wire bond elements of the wire bond portion 314 may have each of the ends connected to an I/O contact pad of two different memory dies 304. For example, as shown in FIG. 3, a second wire bond 314(2) has a first end connected to the I/O contact pad 316(1) of the first memory die 304(1) and a second end connected to the I/O contact pad 316(2) of the second memory die 304(2); a third wire bond 314(3) has a first end connected to the I/O contact pad 316(2) of the second memory die 304(2) and a second end connected to the I/O contact pad 316(3) of a third memory die 304(3) (not shown); and an Nth wire bond 314(N) has a first end connected to an I/O contact pad 316(N−1) of an (N−1)th memory die 304(N−1) (not shown) and a second end connected to an I/O contact pad 316(N) of the Nth memory die 304(N).

The wire bonds 314 and the I/O contact pads 316, in combination, may form a part or a portion of the transmission line, with each wire bond 314 and each I/O contact pad 316 having positions relative to each other in the transmission line 308 that correspond to propagation delay or electrical distance from the packaging portion 312. A signal transmitted from the controller die 102 may take a shorter amount of time to reach a given contact pad or a given wire bond element positioned electrically closer to the packaging portion 312 compared to a given I/O contact pad or a given wire bond element positioned electrically farther from the packaging portion 312.

The memory dies 304, the wire bond elements 314, and the I/O contact pad 316 are numbered in FIG. 3 to correspond to their respective positions in the transmission line. Given an index k, the higher the value of k, the further away a kth memory die 304(k), a kth wire bond element 314(k), and/or a kth I/O contact pad 316(k) are from the packaging portion 312, the PCB portion 310, and the controller 102. In this context, the Nth I/O contact pad 316(N) is the furthest of the I/O contact pads 316 from the packaging portion 312, the PCB portion 310, and/or the controller die 102, and, in turn, is or functions as a memory-side end or termination of the transmission line. Similarly, the Nth die 304(N) is the furthest of the memory dies 304 from the packaging portion 312, the PCB portion 310, and/or the controller die 102. Accordingly, by being the furthest memory die, the Nth die may be referred to herein as an end die, or a termination die, of the plurality of dies 304.

As previously described, the N-number of memory dies 304(1)-304(N) may be part of the same chip enable group. With respect to the packaging components and/or the transmission line 308, the memory dies 304(1)-304(N) may be part of the same chip enable group by being located or mounted on the same die substrate 302, housed within the same outer encasing 303, and/or have I/O contact pads 316 coupled to wire bonds 314 that are connected in series from the packaging portion 312 to the Nth I/O contact pad 316(N) of the Nth memory die 304(N).

The memory dies 304, as part of the same chip enable group, may be configured in any of various ways within the memory system 100. In one example configuration, the N-number of dies 304 may be configured as a die stack. In general, a given die may be a generally planar structure having two opposing planar surfaces, including a first planar surface and a second planar surface. In a die stack, the dies may be disposed on or "stacked" on top of one another, starting with a first or base die and extending in a direction perpendicular to planar surfaces of the dies. As a die stack, one planar surface of one die may face and/or contact a planar surface of a second die. Also, two dies are adjacent to each other where no other dies of the stack are disposed in between them. Also, in some example configurations, a first or base die may be disposed or mounted on a base substrate or a printed circuit board directly. A last or Nth die of the stack may be the die that is disposed furthest from the base substrate or printed circuit board on which the die stack is mounted.

One type of die stack is a staircase stack. In a staircase stack, the dies may be stacked on top of one another such that the dies do not completely cover each other. Instead, each die has an exposed portion where respective I/O contact pads may be disposed and connected with each other via wire bonds. By disposing the dies on top of one another to create exposed portions, the dies of the die stack, when viewed from the side, have a "staircase" shape, which each die being one of the "steps" of the staircase.

Figure 4:
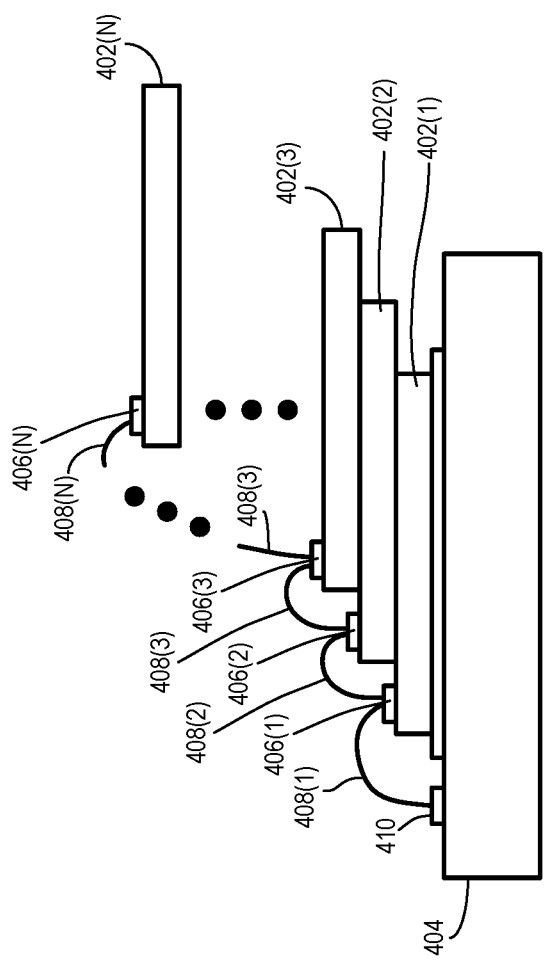
FIG. 4 is cross-sectional side view of a plurality of memory dies integrated as a stack.

FIG. 4 shows a side view of a plurality of memory dies 402(1)-402(N) integrated or configured as a staircase stack. The plurality of memory dies 402(1)-402(N) may be representative of the plurality of memory dies 304(1)-304(N), and illustrate an example configuration in which the plurality of memory dies 304(1)-304(N) may be integrated with each other and the packaging.

In the example configuration shown in FIG. 4, the stack of dies 402 may be disposed on a die substrate 404. In particular, a first die 402(1) may be in contact with and/or be the closest of the memory dies 402 to the die substrate 404. The other memory dies 402(2)-402(N) are stacked on the first memory die 402(1) in a staircase configuration such that the second memory die 402(2) is disposed on the first memory die 402(1), the third memory die 402(3) is disposed on the second memory die 402(2), and the Nth memory die 402(N) is disposed on an (N−1)th memory die 402(N−1) (not shown).

Also, each of the memory dies 402(1)-402(N) may have respective I/O contact pads. The side view of FIG. 4 shows a contact pad 406 on each of the dies 402, with the first memory die 402(1) including a first contact pad 406(1), the second memory die 402(2) including a second contact pad 406(2), the third memory die 402(3) including a third contact pad 406(3), and the Nth memory die 402(N) including an Nth contact pad 406(N).

The staircase stack of dies 402 may also be configured with an N-number of wire bond elements 408. In particular, a first wire bond element 408(1) connects to the first I/O contact pad 406(1) of the first die 402(1) and to a contact pad 410 of the die substrate 404. In addition, the second through Nth wire bonds 408(2) to 408(N) are each connected to two I/O contact pads 408 of two adjacent dies 402 in the staircase stack. For example, a second wire bond 408(2) is connected to the first I/O contact pad 406(1) on the first die 402(1) and the second I/O contact pad 406(2) of the second die 702(2); a third wire bond 408(3) connects to the second I/O contact pad 406(2) of the second die 402(2) and to the third I/O contact pad 406(3) of the third die 402(3); and an Nth wire bond element 408(N) connects to an (N−1)th I/O contact pad 406(N−1) of an (N−1)th die 402(N−1) (not shown) and to the Nth I/O contact pad 406(N) of the Nth die 402(N).

Referring back to FIG. 3, the controller die 102 is shown as including the controller I/O circuitry 136, which is configured to send and receive signals communicated on the transmission lines 134, as previously described with respect to FIG. 2A. With respect to the configuration in FIG. 3, the controller I/O circuitry 136 is configured to send and receive signals communicated on the transmission line 308. For situations or embodiments where the controller 102 is to send a signal (e.g., a data signal, a clock signal, or a command signal) to the memory dies 304 via the transmission line 308, an output driver circuit of the controller I/O circuitry 136 generates and outputs the signal to the transmission line 308. In addition, for situations or embodiments where the controller 102 is to receive a signal from the memory dies 304 via the transmission line 308, an input circuit (e.g., an input buffer circuit) of the controller I/O circuitry 136 is configured to receive the signal from the transmission line 308.

Similarly, FIG. 3 shows each of the memory dies 304 as including respective memory I/O circuitry 158, as previously described with respect to FIG. 2B. For example, in FIG. 3, the first memory die 304(1) includes first memory I/O circuitry 158(1), the second memory die 304(2) includes second memory I/O circuitry 158(2), and the Nth memory die 304(N) includes Nth memory I/O circuitry 158(N). Each of the memory I/O circuitries 158 is configured to send and/or receive signals communicated on the transmission line 308. For situations or embodiments where a given kth memory die 304(k) is to send a signal (e.g., a data signal, a clock signal, or a command signal) to the controller die 102 via the transmission line 308, an output driver circuit of the kth memory I/O circuitry 158(k) generates and outputs the signal to the transmission line 308. In addition, for situations or embodiments where a given kth memory die 304(k) is to receive a signal from the controller die 102 via the transmission line 308, an input circuit (e.g., an input buffer circuit) of the kth memory I/O circuitry 158(k) is configured to receive the signal from the transmission line 308.

The various portions of the transmission line 308 may have associated characteristic impedances. For example, the PCB portion 310 may have an associated characteristic impedance that is dependent on certain physical aspects or properties of the printed circuit board 306, such as the substrate material and thickness, and the material and dimensions of the conductive elements (e.g., the conductive trace) of the PCB portion 310 of the transmission. One example characteristic impedance value for the PCB portion 310 is 50Ω, although other values may be possible.

Figure 5:
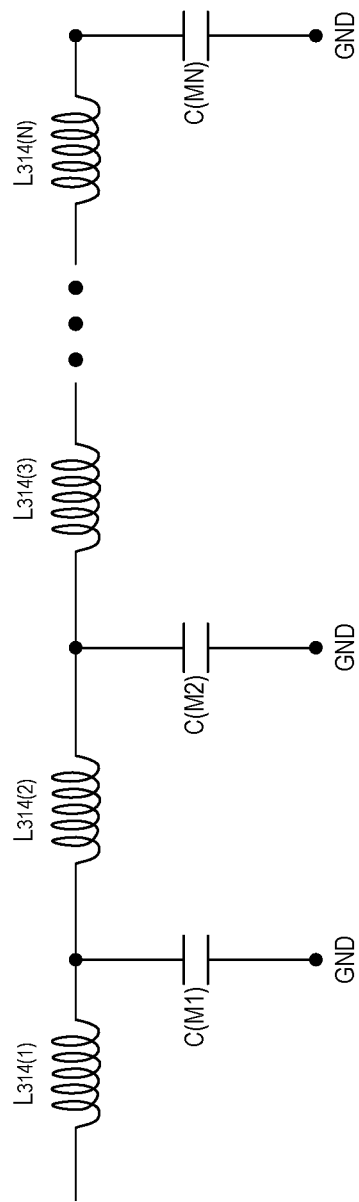
FIG. 5 is a circuit model of a wire bond portion of the transmission line of FIG. 3.

The portion of the transmission line 308 that extends over the wire bond portion 314 may also have an associated characteristic impedance dependent on inductance values of the wire bonds 314 and the die capacitance of the memory dies 304. FIG. 5 shows a circuit schematic diagram of the inductance L provided by the wire bonds 314 and the die capacitance C(M) of the memory dies 304 corresponding to the configuration of FIG. 3. In particular, a first inductor $L_{314(1)}$ indicates the inductance of the first wire bond 314(1), a second inductance $L_{314(2)}$ indicates the inductance of the second wire bond 314(2), a third inductance $L_{314(3)}$ indicates the inductance of the third wire bond 314(3), and an Nth inductance $L_{314(N)}$ indicates the inductance of the Nth wire bond 314(N). Additionally, a first capacitor C(M1) represents a die capacitance of the first memory die 304(1), a second capacitor C(M2) represents a die capacitance of the second memory die 304(2), and an Nth capacitor C(MN) represents a die capacitance of the Nth memory die 304(N). As shown in FIG. 5, the inductors $L_{314}$ are connected in series with each other, and the die capacitances C(M) are connected in shunt with respect to the inductors $L_{314}$ and with reference to ground (GND). The associated characteristic impedance of the wire bonds 314 is dependent on or determined by the square root of the inductance L divided by the capacitance C.

The quality of the signal transmission over the transmission line 308 may depend on the associated characteristic impedances of the different portions of the transmission line 308. The more closely the characteristic impedances are matched, the lower the signal reflection and energy loss of a signal communicated on the transmission line 308, and in turn the higher the quality or integrity of the signal communication on the transmission line 308. Conversely, the farther apart the characteristic impedance values, the higher the signal reflection and energy loss of a signal communicated on the transmission line 308, and in turn the lower the quality or integrity of the signal communication on the transmission line 308. The negative effects of impedance mismatches may become augmented or more pronounced as signal frequencies or data rates increase, especially as they increase up into the Gigahertz ranges.

Certain impedance matching techniques involve termination at the ends of the transmission lines. To illustrate, for situations or embodiments where a kth memory die 304(k) is transmitting a signal to the controller die 102, a relatively large impedance mismatch would be at the controller-end of the transmission line 308 if that end is left unterminated. An unterminated controller end effectively results in an open circuit, resulting in a relatively large impedance mismatch with the characteristic impedance of the PCB portion 310, and in turn, undesirably large signal degradation.

To minimize this mismatch, the controller die 102 may include a controller-side on-die termination (ODT) resistance circuit 320 coupled to the controller end of the transmission line 308 that provides a controller-side termination resistance for the transmission line 308. The resistance that the controller-side ODT resistance circuit 320 provides may be equal or substantially equal to the associated characteristic impedance of the PCB portion 310. In addition to providing impedance matching at the controller end, the controller-side ODT resistance circuit 320 also maintains the common mode (or average) voltage level of the signal communicated on the transmission line 308 by being coupled to both a high voltage and a low voltage. In the example configuration in FIG. 3, the high voltage may be a supply voltage VCC and the low voltage may be a ground voltage level GND. The high voltage level VCC and the low voltage level GND may provide rail-to-rail voltage levels for signals communicated on the transmission line 308. That is, when a signal is transmitted on the transmission line, the signal includes pulses that transition between associated high and low levels at or sufficiently close to VCC and GND. In turn, the common mode (or average) voltage level of the signal is half the high voltage level VCC, or VCC/2. In the receive mode, the input buffer of the controller I/O circuitry 136 may include a differential comparator that compares the level of the signal with the common mode voltage level VCC/2. Where the comparator detects that a pulse of the signal is greater than the common mode voltage level VCC/2, the comparator may determine that the pulse is transmitted at the associated high level, and where the comparator detects that the pulse of the signal is less than the common mode voltage level VCC/2, the comparator may determine that the pulse is transmitted at the associated low level.

In order to ensure that the signal maintains the common mode voltage VCC/2 so that the comparator detects the correct voltage levels of the signal pulses, the controller-side ODT resistance circuit 320 is coupled to both the high supply voltage VCC and to the low voltage (e.g., GND). In turn, the controller-side ODT resistance circuit 320 provides impedance matching by having two resistor elements, including a first resistor element Rc1 and a second resistor element Rc2. As shown in FIG. 3, the first resistor element Rc1 is coupled to the high supply voltage VCC and to a midpoint that is coupled to the controller end of the transmission line 308. Additionally, the second resistor element Rc2 is coupled to the ground GND and the midpoint. In particular example configurations, the first and second resistor elements Rc1, Rc2 have the same value, each twice the value of the characteristic impedance of the PCB portion 310, in order to provide, through voltage division, a common mode voltage of VCC/2, and a resistance that is equal to the characteristic impedance of the PCB portion 310. However, because the controller-side ODT resistance circuit 320 is coupled to the high supply voltage VCC, it draws a current, resulting in undesirable power consumption.

Another place where characteristic impedance mismatch may occur on the transmission line 308 is between the PCB portion 310 and the wire bond portion 314. In some example configurations, the characteristic impedance over the wire bond portion 314 is lower than the characteristic impedance of the PCB portion 310, such as about five times lower as an example.

Figure 6:
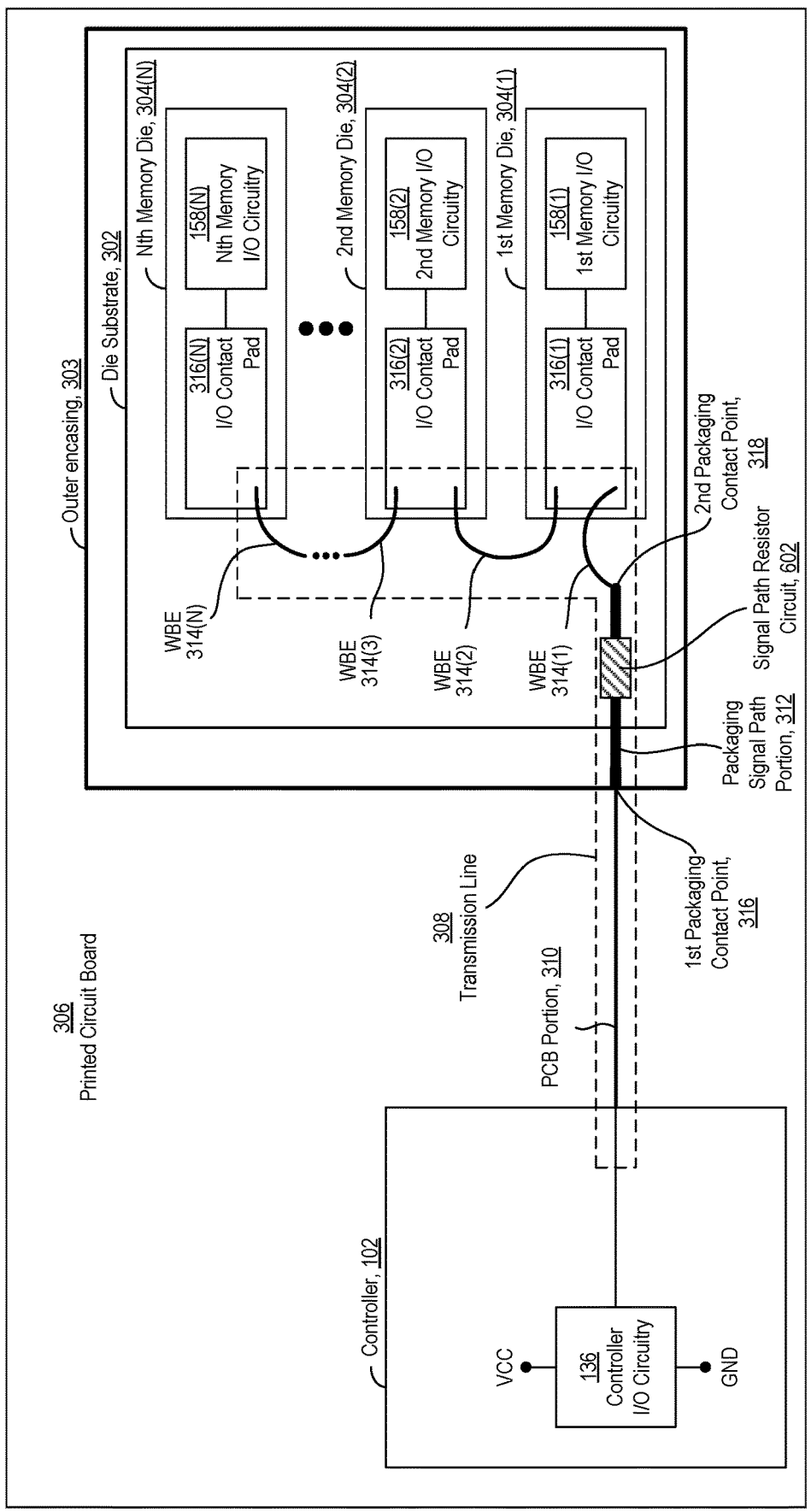
FIG. 6 is a physical layout of another example configuration of at least some of the components of the controller and an N-number of the plurality of memory dies of FIGS. 1A-2B, with a resistor circuit positioned within an outer encasing of a memory die package.

FIG. 6 shows a physical layout of another example configuration of at least some of the components of the controller die 102 and the plurality of memory dies 104 shown in FIGS. 1A-2B. The example configuration of FIG. 6 is similar to that of FIG. 3, except that the configuration of FIG. 6 removes the controller-side ODT resistance circuit 320, and further includes a signal path resistor circuit 602.

As shown in FIG. 6, the signal path resistor circuit 602 is positioned or integrated with the transmission line 308 in between the PCB portion 310 and the wire bond portion 314, such that the signal path resistor circuit 602 is connected in series (as opposed to in shunt) with the PCB portion 310 and the wire bond portion 314. In the example configuration shown in FIG. 6, the signal path resistor circuit 602 is positioned or disposed within the outer encasing 303. For example, the signal path resistor circuit 602 may be disposed or mounted on a planar surface of the die substrate 302, such as the same planar surface to which the first wire bond 314(1) connects to the second packaging contact point 318. The signal path resistor circuit 602 may be positioned in series in the packaging portion 312 of the transmission line 316 in between the first contact point 316 and the second contact point 318. Positioning the signal path resistor circuit 602 as close to the second packaging contact point 318 and/or the wire bond portion 314 as possible may provide optimal performance.

Accordingly, in a method of operation where a given kth memory die 304(k) transmits a signal to the controller die 102 via the transmission line 308, an output driver circuit (such as a push-pull circuit) of the kth memory I/O circuitry 158(k) may generate the signal and output the signal to a kth I/O contact pad. The signal may propagate over at least a part of the wire bond portion 314 (e.g., propagate over at least one wire bond), then pass through the signal path resistor circuit 602, before exiting the outer encasing 303, and then propagating on the PCB portion 310 until reaching the controller die 102. Additionally, in a method of operation where the controller die 102 transmits a signal to a given kth memory die 304(k), an output driver circuit (such as a push-pull circuit) of the controller I/O circuitry 136 generates and transmits the signal on the PCB portion 310. The signal then passes through the signal path resistor circuit 602 before reaching the wire bond portion 314. The signal then propagates over at least a part of the wire bond portion 314, then passes through the kth I/O contact pad 316(k), and is then received by an input buffer of the kth memory I/O circuitry 158(k).

In addition, for some example embodiments, the signal path resistor circuit 602 includes a single, discrete resistor element having a single resistance value. In other example embodiments, the signal path resistor circuit 602 includes a plurality or a network of discrete resistor elements, connected in series, parallel, or a combination thereof, and that have or provide an effective resistance value. In addition, the signal path resistor circuit 602 may have any of various configurations, made of any of various materials, and/or have any of various form factors suitable for integration within the outer encasing 303 and/or the other packaging components of the memory dies 304. In addition or alternatively, for at least some of the configurations, the signal path resistor circuit 602 may be a surface mount component configured for being surface mounted onto a planar surface of the die substrate 302.

Additionally, for some example configurations, the signal path resistance circuit 602 may have a resistance value that is in between the characteristic impedance value of the PCB portion 310 and the wire bond portion 314. In general, the reflection coefficient for a signal provided by two portions of a transmission line with different characteristic impedances is equal to the difference of their characteristic impedances divided by their sum. In turn, by configuring the signal path resistance circuit 602 with a resistance value that is in between the characteristic impedances of the PCB portion 310 and the wire bond portion 314, the reflection coefficients determined by the PCB portion 310 and the signal path resistor circuit 602, and by the signal path resistor circuit 602 and the wire bond portion 314, may each be lower than a reflection coefficient determined by the PCB portion 310 and the wire bond portion 314.

To illustrate, suppose for example that the characteristic impedance of the PCB portion 310 is 50Ω, the characteristic impedance of the wire bond portion 314 is 10Ω, and the resistance value of the signal path resistor circuit 602 is 25Ω. For such values, the reflection coefficient determined by the PCB portion 310 and the wire bond portion 314 is 0.67. However, the reflection coefficient determined by the PCB portion 310 and the signal path resistor circuit 602 is 0.33, and the reflection coefficient determined by the signal path resistor 602 and the wire bond portion 314 is 0.42—i.e., both lower (better than) than 0.67.

By adding in series the signal path resistor circuit 602, and in turn reducing the reflection coefficients, a signal propagating over the wire bond portion 314 and the PCB portion 310 may experience less reflection and in turn, less energy loss, resulting in a more efficient transmission line compared to if the signal path resistor circuit 602 is not included. Moreover, the reduction in reflection coefficient may be significant enough such that the transmission line 308 may not need to be terminated at the controller end with an ODT resistance circuit. Accordingly, FIG. 6 shows the controller die 102 configured without the controller-side ODT resistance circuit 320, in contrast to the configuration in FIG. 3. By eliminating the controller-side ODT resistance circuit 320, power consumption may desirably be saved since the controller-side ODT resistance circuit 320 is not present to draw current.

In addition, or alternatively to setting the resistance value of the signal path resistor circuit 602 to a value in between the characteristic impedances of the PCB portion 310 and the wire bond portion 314, the resistance value may depend on an output impedance of an output driver circuit (e.g., such as a push-pull circuit) of memory I/O circuitry 158 configured to generate and transmit signals over the transmission. For at least some of these configurations, the resistance value may further depend on the characteristic impedance of the PCB portion 310. In particular example configurations, the signal path resistor portion 602 may have a resistance value such that a sum of the resistance value and an output resistance value of the output driver circuit is in a range dependent on the characteristic impedance of the PCB portion 310. In some example embodiments, the range is from about 35% lower than the characteristic impedance of the PCB portion 310 to about 35% higher than the characteristic impedance of the PCB portion 310. In other example embodiments, the range is from about 10% lower than the characteristic impedance of the PCB portion 310 to about 10% higher than the characteristic impedance of the PCB portion 310. In still other example embodiments, the range is from about 65% to about 90% of the characteristic impedance of the PCB portion. Various other ranges dependent on the characteristic impedance of the PCB portion 310 may be possible.

Figure 7:
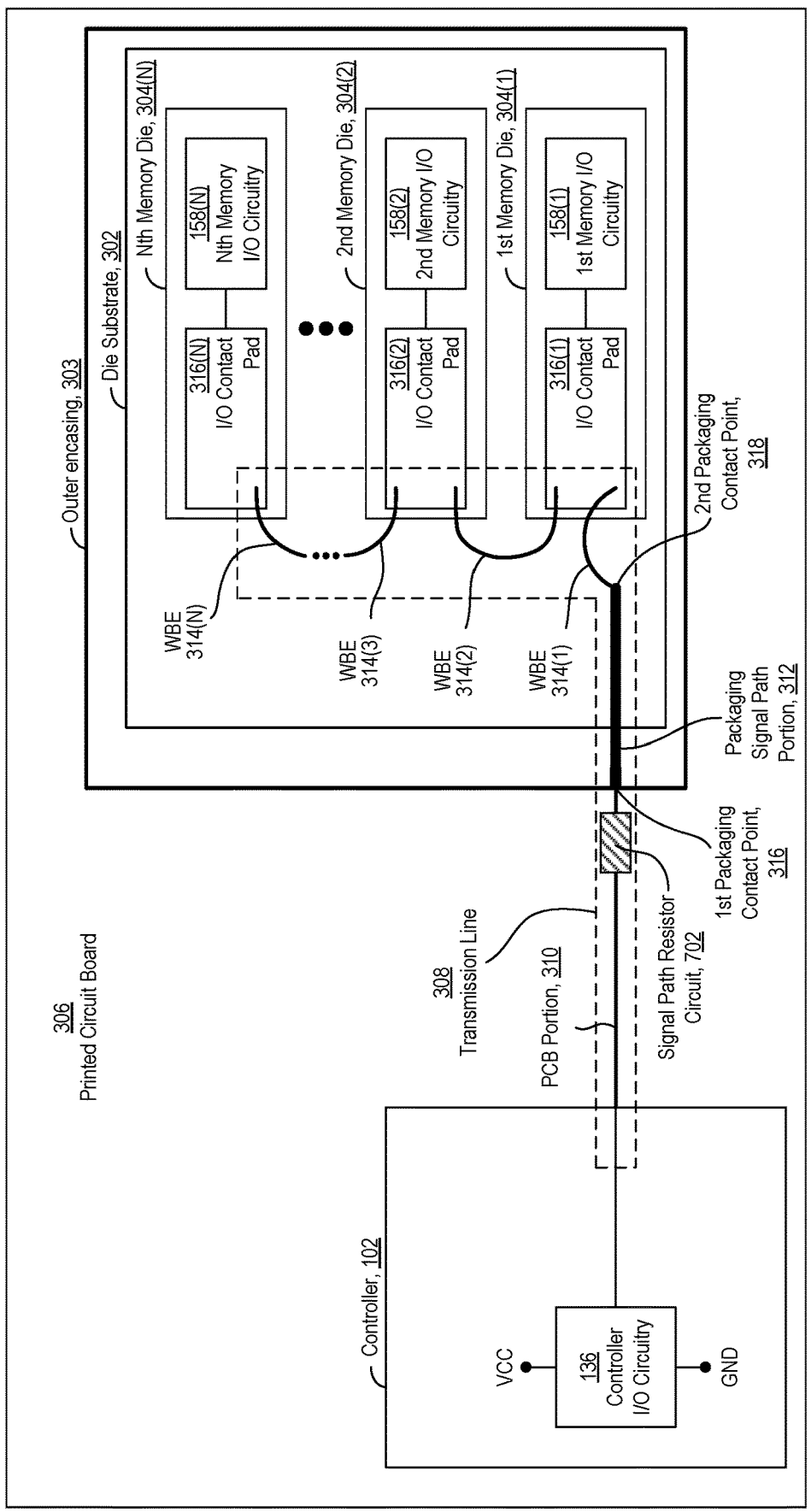
FIG. 7 is a physical layout of another example configuration of at least some of the components of the controller and an N-number of the plurality of memory dies of FIGS. 1A-2B, with a resistor circuit positioned outside of an outer encasing of a memory die package.

FIG. 7 shows a physical layout of another example configuration of at least some of the components of the controller die 102 and the plurality of memory dies 104 shown in FIGS. 1A-2B. The example configuration of FIG. 7 is similar to that of FIG. 6, except that the example configuration of FIG. 7 includes a signal path resistor circuit 702 configured outside of, instead of within, the outer encasing 303 of the memory die packaging. For example, as illustrated in FIG. 7, the signal path resistor circuit 702 is integrated with the printed circuit board 306, such as by being mounted on a planar surface of the printed circuit board 306. In doing so, the signal path resistor circuit 702 is connected in series with the PCB portion 310, breaking apart a direct connection that the PCB portion 310 may have with the packaging portion 312. Accordingly, in operation, a signal transmitted from the memory dies 304 to the controller die 102 via the transmission line 308, upon passing through the first packaging contact point 316, passes through the signal path resistor circuit 702 before propagating over a part of the PCB portion 702 in direct connection with an I/O contact pad (not shown) of the controller die 102. Similarly, a signal transmitted from the controller die 102 to the memory dies 304 via the transmission line 308 passes through the signal path resistor circuit 702 before reaching the first packaging contact point 316. For optimal performance, signal path resistor circuit 702, connected in series with the PCB portion 310, may be positioned as close to the first packaging contact point 316 as possible. For example, where the first packaging contact point 316 is a solder ball of a ball grid array, signal path resistor circuit 702 is positioned as close to the solder ball as possible.

Figure 8:
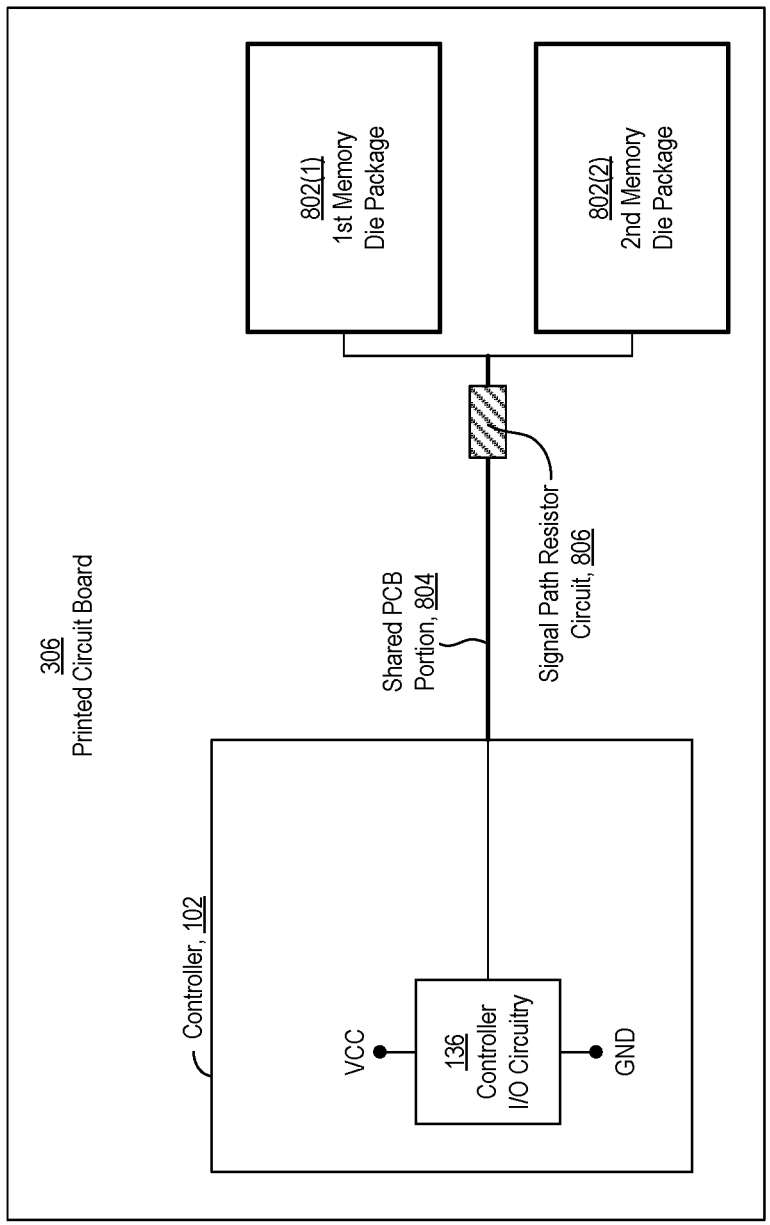
FIG. 8 is a physical layout of another example configuration of at least some of the components of the controller and the plurality of memory dies of FIGS. 1A-2B, where the plurality of memory dies are disposed within multiple memory die packages, and where a resistor circuit is positioned outside of the multiple memory die packages.

Placing the signal path resistor circuit 702 outside of the outer encasing 303 and integrating it with the PCB portion 310 of the transmission line 308 may allow multiple transmission paths connected to different chip enable groups or stacks of memory dies to share a common signal path resistor circuit. FIG. 8 shows another example configuration of the memory system 100 of FIGS. 1A-2B, where the memory dies 104 are arranged or organized into a plurality of chip enable groups or die stacks, where each group of memory dies may be encased in its own packaging. Accordingly, like the other configurations described with reference to FIGS. 3, 6, and 7, FIG. 8 shows the controller die 102 configured without a controller-side ODT resistance circuit, and integrated with the printed circuit board 306. However, in contrast to the configurations of FIGS. 3, 6, and 7, the example configuration in FIG. 8 includes two memory die packages 802, including a first memory die package 802(1) and a second memory die package 802(2). Each of the memory die packages 802 may include a respective group of memory dies, such as in the form of a die stack, connected together with respective wire bond portions, and mounted on a die substrate and/or housed in an outer encasing, like the memory die configurations in FIGS. 3, 4, 6, and 7. The memory die packages 802(1), 802(2) may be mounted on the same planar surface or opposing planar surfaces of the printed circuit 306, in various embodiments.

The wire bond portions in the different memory die packages 802(1), 802(2) may form separate transmission lines that share a common or shared PCB portion 804, which may be configured the same as or similar to the PCB portion 310, as previously described with reference to FIGS. 3, 6, and 7. In this way, the first and second memory dies 802(1), 802(2) are each configured to share the same portion of a transmission line that is integrated with the printed circuit board 306 in order to communicate with the controller die 102.

In FIG. 8, a signal path resistor circuit 806 is configured outside of the memory die packages 802(1), 802(2), and integrated in series with the shared PCB portion 804, which may be the same as or similar to the signal path resistor circuit 702 of FIG. 7. In this way, when a memory die of either the first memory die package 802(1) or the second memory die package 802(2) wants to send a signal to the controller die 102, the signal passes through the signal path resistor circuit 806 before reaching the controller die 102 via the shared PCB portion 804. Similarly, when the controller die 102 wants to send a signal to the first memory die package 802(1) or the second memory die package 802(2), the signal propagates over shared PCB portion 802 and passes through the signal path resistor circuit 806 before reaching propagating over a wire bond portion of either the first memory die package 802(1) or the second memory die package 802(2). Accordingly, positioning the signal path resistor circuit 806 outside of the memory die packaging may be advantageous for multiple memory die package configurations in that a single signal path resistor can be used, irrespective or independent of the number of memory die packages (or die stacks).

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. An apparatus comprising:
   a controller die;
   a group of dies; and
   a transmission line coupling the controller die with the group of dies, the transmission line comprising:
   a first portion integrated with a printed circuit board;
   a second portion comprising a plurality of wire bonds, wherein the plurality of wire bonds couple together the group of dies; and
   a resistor circuit connected in series with the first portion and the second portion;
   wherein the first portion and the resistor circuit are positioned between the controller die and the second portion.

2. The apparatus of claim 1, wherein the controller die is configured without an on-die termination resistance circuit coupled to the transmission line.

3. The apparatus of claim 1, wherein the resistor circuit has a resistance value in between an impedance of the first portion and an impedance of the second portion.

4. The apparatus of claim 1, wherein the resistor circuit is disposed within an outer encasing that houses the group of dies.

5. The apparatus of claim 4, wherein the resistor circuit is disposed on a die substrate on which the group of dies are disposed.

6. The apparatus of claim 1, wherein the resistor circuit is disposed outside of an outer encasing that houses the group of dies.

7. The apparatus of claim 1, wherein the resistor circuit is disposed on a planar surface of the printed circuit board.

8. An apparatus comprising:
a controller die;
a group of dies; and
a transmission line coupled to the controller die and the group of dies, the transmission line comprising:
  a first portion integrated with a printed circuit board;
  a second portion comprising a plurality of wire bonds; and
  a resistor circuit connected in series with the first portion and the second portion;
wherein the group of dies comprises a first group of dies that is part of a first die package, the apparatus further comprising a second group of dies that is part of a second die package, and wherein the first die package and the second die package both transmit signals through the resistor circuit in order to communicate with the controller die.

9. The apparatus of claim 1, wherein a die of the group of dies comprises an output driver circuit configured to generate a signal for transmission onto the transmission line with an output impedance, and
wherein a sum of a resistance value of the resistor circuit and the output impedance is dependent on an impedance of the first portion.

10. The apparatus of claim 9, wherein the sum is in a range from about 65% to 90% of the impedance of the first portion.

11. A method comprising:
transmitting a signal from an input/output pad of a first die over a wire bond portion of a transmission line;
passing the signal through a resistor circuit connected in series with the wire bond portion after transmitting the signal over the wire bond portion; and
propagating the signal over a printed circuit board portion of the transmission line to a second die after passing the signal through the resistor circuit, wherein the printed circuit board portion and the resistor circuit are positioned between the second die and the wire bond portion.

12. An apparatus comprising:
means for transmitting a signal from an input/output pad of a first die over a wire bond portion of a transmission line;
means for passing the signal through a resistor circuit connected in series with the wire bond portion after transmitting the signal over the wire bond portion; and
means for propagating the signal over a printed circuit board portion of the transmission line to a second die after passing the signal through the resistor circuit, wherein the printed circuit board portion and the resistor circuit are positioned between the second die and the wire bond portion.

13. The apparatus of claim 12, further comprising a controller die configured without an on-die termination resistance circuit coupled to the transmission line.

14. The apparatus of claim 12, wherein the resistor circuit has a resistance value in between an impedance of a first portion of the transmission line and an impedance of a second portion of the transmission line.

15. The apparatus of claim 12, wherein the resistor circuit is disposed within an outer encasing that houses a group of dies.

16. The apparatus of claim 12, wherein the resistor circuit is disposed outside of an outer encasing that houses a group of dies.

17. The apparatus of claim 12, wherein the resistor circuit is disposed on a planar surface of a printed circuit board.

18. An apparatus comprising:
means for transmitting a signal from an input/output pad of a first die over a wire bond portion of a transmission line;
means for passing the signal through a resistor circuit connected in series with the wire bond portion after transmitting the signal over the wire bond portion;
means for propagating the signal over a printed circuit board portion of the transmission line to a second die after passing the signal through the resistor circuit; and
a group of dies comprising a first group of dies that is part of a first die package and a second group of dies that is part of a second die package, wherein the first die package and the second die package both transmit signals through the resistor circuit in order to communicate with a controller die.

19. The apparatus of claim 12, further comprising a die comprising an output driver circuit configured to generate a signal for transmission onto the transmission line with an output impedance, wherein a sum of a resistance value of the resistor circuit and the output impedance is dependent on an impedance of a first portion of the transmission line.

20. The apparatus of claim 19, wherein the sum is in a range from about 65% to 90% of the impedance of the first portion.

* * * * *